US011735478B2

United States Patent
Frasca et al.

(10) Patent No.: US 11,735,478 B2
(45) Date of Patent: Aug. 22, 2023

(54) SYSTEM AND METHOD FOR REMOVING SCALLOPING AND TAPERING EFFECTS IN HIGH ASPECT RATIO THROUGH-SILICON VIAS OF WAFERS

(71) Applicant: ECOLE POLYTECHNIQUE FEDERALE DE LAUSANNE (EPFL), Lausanne (CH)

(72) Inventors: Simone Frasca, Lausanne (CH); Edoardo Charbon, Jouxtens-Mézery (CH); Sandro Carrara, La Conversion (CH); Rebecca Leghziel, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 225 days.

(21) Appl. No.: 17/243,613

(22) Filed: Apr. 29, 2021

(65) Prior Publication Data
US 2021/0351075 A1 Nov. 11, 2021

Related U.S. Application Data

(60) Provisional application No. 63/020,147, filed on May 5, 2020.

(51) Int. Cl.
*H01L 21/768* (2006.01)
*H01L 21/3065* (2006.01)
*H01L 21/033* (2006.01)

(52) U.S. Cl.
CPC .... *H01L 21/76898* (2013.01); *H01L 21/0337* (2013.01); *H01L 21/30655* (2013.01)

(58) Field of Classification Search
CPC .......... H01L 21/3065; H01L 21/30655; H01L 21/30608; H01L 21/30621; H01L 21/3083; H01L 21/76898
See application file for complete search history.

(56) References Cited

U.S. PATENT DOCUMENTS

| 5,501,893 A | 3/1996 | Laermer et al. |
| 2005/0101100 A1* | 5/2005 | Kretchmer ............ H01L 21/763 257/E21.546 |

FOREIGN PATENT DOCUMENTS

EP 0625285 B1 3/2000

OTHER PUBLICATIONS

Coburn, J. W., & Winters, H. F. (1989). Conductance considerations in the reactive ion etching of high aspect ratio features. Applied Physics Letters, 55(26), 2730-2732.
(Continued)

*Primary Examiner* — Walter H Swanson
(74) *Attorney, Agent, or Firm* — Nixon & Vanderhye P.C.

(57) ABSTRACT

A method for manufacturing vias in a silicon wafer, the silicon wafer having a <110> crystal orientation, and having a <111> plane that is perpendicular to a surface of the wafer, tilted by 35.26°, the method comprising the steps of providing a mask having a rhomboidal-shaped opening onto a surface of the silicon wafer, such that edges of the rhomboidal-shaped opening line up with a <111> plane of a crystalline structure of the silicon wafer, etching a hole in the silicon wafer at the rhomboidal-shaped opening, and polishing the hole after the etching by a anisotropic etching.

9 Claims, 8 Drawing Sheets

(56) References Cited

OTHER PUBLICATIONS

Fischer, A. C., Bleiker, S. J., Haraldsson, T., Roxhed, N., Stemme, G., & Niklaus, F. (2012). Very high aspect ratio through-silicon vias (TSVs) fabricated using automated magnetic assembly of nickel wires. Journal of micromechanics and microengineering, 22(10), 105001.

Gambino, J. P., Adderly, S. A., & Knickerbocker, J. U. (2015). An overview of through-silicon-via technology and manufacturing challenges. Microelectronic Engineering, 135, 73-106. http://www.sciencedirect.com/science/article/pii/S0167931714004511.

Killge, S., Neumann, V., & Bartha, J. W. (2016). Copper-based TSV: Interposer. In 3D Stacked Chips (pp. 9-28). Springer, Cham.

Li, H., Liu, J., Xu, T., Xia, J., Tan, X., & Tao, Z. (2018). Fabrication and optimization of high aspect ratio through-silicon-vias electroplating for 3D inductor. Micromachines, 9(10), 528.

Li, Y., Zhang, H., Yang, R., Laffitte, Y., Schmill, U., Hu, W., . . . & Cui, B. (2019). Fabrication of sharp silicon hollow microneedles by deep-reactive ion etching towards minimally invasive diagnostics. Microsystems & nanoengineering, 5(1), 1-11.

Lin, P. R., Zhang, G. Q., van Zeijl, H. W., Lian, B. H., Wang, Y., & Yao, Q. B. (2015). Effects of silicon via profile on passivation and metallization in TSV interposers for 2.5 D integration. Microelectronic Engineering, 134, 22-26.

Motoyoshi, M. (2009). Through-silicon via (TSV). Proceedings of the IEEE, 97(1), 43-48.

Owen, K. J., VanDerElzen, B., Peterson, R. L., & Najafi, K. (Jan. 2012). High aspect ratio deep silicon etching. In 2012 IEEE 25th International Conference on Micro Electro Mechanical Systems (MEMS) (pp. 251-254). IEEE.

Parasuraman, J., Summanwar, A., Marty, F., Basset, P., Angelescu, D. E., & Bourouina, T. (2014). Deep reactive ion etching of sub-micrometer trenches with ultra high aspect ratio. Microelectronic engineering, 113, 35-39.

Ranganathan, N., Lee, D. Y., Youhe, L., Lo, G. Q., Prasad, K., & Pey, K. L. (2011). Influence of Bosch etch process on electrical isolation of TSV structures. IEEE Transactions on components, packaging and manufacturing technology, 1(10), 1497-1507.

Sekiguchi, M., Numata, H., Sato, N., Shirakawa, T., Matsuo, M., Yoshikawa, H., . . . & Takahashi, K. (May 2006). Novel low cost integration of through chip interconnection and application to CMOS image sensor. In 56th Electronic Components and Technology Conference 2006 (pp. 8-pp). IEEE.

Shen, W. W., & Chen, K. N. (2017). Three-dimensional integrated circuit (3D IC) key technology: through-silicon via (TSV). Nanoscale research letters, 12(1), 1-9.

Tillocher, T., Dussart, R., Mellhaoui, X., Lefaucheux, P., Boufnichel, M., & Ranson, P. (2007). Silicon cryo-etching of deep holes. Microelectronic engineering, 84(5-8), 1120-1123.

Wei, T., Cai, J., Wang, Q., Hu, Y., Wang, L., Liu, Z., & Wu, Z. (2014). Optimization and evaluation of sputtering barrier/seed layer in through silicon via for 3-D integration. Tsinghua Science and Technology, 19(2), 150-160.

Xu, T., Tao, Z., Li, H., Tan, X., & Li, H. (2017). Effects of deep reactive ion etching parameters on etching rate and surface morphology in extremely deep silicon etch process with high aspect ratio. Advances in Mechanical Engineering, 9(12), 1687814017738152.

Yeom, J., Wu, Y., Selby, J. C., & Shannon, M. A. (2005). Maximum achievable aspect ratio in deep reactive ion etching of silicon due to aspect ratio dependent transport and the microloading effect. Journal of Vacuum Science & Technology B: Microelectronics and Nanometer Structures Processing.

* cited by examiner

| Process | | ICP Power (W) | Cycle (s) | Gas | Flow Rate (sccm) | RF Power (W) | Pressure (mbar) |
|---|---|---|---|---|---|---|---|
| Standard DRIE (20°) | Passivation | 1800 | 2 | $C_4F_8$ | 300 | 45 | 4 |
| | Etching | 1800 | 6 | $SF_6$ | 300 | 45 | 4 |
| Ramping DRIE (0°) | Passivation | 1500 | 2-3 | $C_4F_8$ | 300 | 90-110 | 0.4 |
| | Depassivation | 1500 | 1 | $O_2$ | 100 | 90-110 | 0.4 |
| | Etching | 1500 | 3-5 | $SF_6$ | 300 | 90-110 | 0.4 |

FIG. 4

| Work | Typical Size | Aspect Ratio | AR/Size | Etching Process |
|---|---|---|---|---|
| H. Li et al. (2018) [15] | 100 μm | 10:1 | 0.10 μm$^{-1}$ | DRIE |
| Y. Li et al. (2019) [16] | 30 μm | 10:1 | 0.33 μm$^{-1}$ | Modified DRIE |
| Tillocher et al. (2007) [17] | 14 μm | 15:1 | 1.07 μm$^{-1}$ | Cryo-etching |
| Shen et al. (2017) [1] | 2 μm | 15:1 | 7.5 μm$^{-1}$ | DRIE |
| Motoyoshi et al. (2009) [2] | 1.4 μm | 20:1 | 14.3 μm$^{-1}$ | DRIE |
| Fischer et al. (2012) [18] | 20 μm | 24:1 | 1.2 μm$^{-1}$ | DRIE |
| This work | 1 μm | 28:1 | 28 μm$^{-1}$ | Modified DRIE |

Hole before KOH etch. Aligned to the <111> plane perfectly

Hole before KOH etch. Not aligned to the <111> plane perfectly

Hole before KOH etch. Not even a rhomboid.

Hole after KOH etch (black). Basically same hole, but without surface roughness

Hole after KOH etch (black). Bigger hole, without surface Roughness and well aligned Hole after KOH etch (black). Bigger hole, without surface Roughness and well aligned

SYSTEM AND METHOD FOR REMOVING SCALLOPING AND TAPERING EFFECTS IN HIGH ASPECT RATIO THROUGH-SILICON VIAS OF WAFERS

CROSS-REFERENCE TO RELATED APPLICATIONS

The present patent application claims priority to Provisional Patent Application No. 63/020,147 that was filed on May 5, 2020, the contents thereof herewith incorporated by reference in its entirety.

FIELD OF THE INVENTION

The present invention is directed to the field of semiconductor devices manufacturing, more particularly methods and systems of manufacturing holes or through-silicon vias (TSV).

In the last seventy (70) years, the continuous downscaling of semiconductor devices has offered increased device speed and density increases following Moore's prediction. However, as feature sizes got smaller, down to the current seven (7) nm, for example by the manufacturers Qualcomm™, Apple™, Huawei™, there is a physical limitation in scaling before entering the realm of quantum effects. The semiconductor community shifted towards a three-dimensional (3D) integration paradigm to achieve higher electrical component density and increased performance. In this context, one of the most promising technologies is the through-silicon via (TSV) [1].

TSVs are electrical connections etched through silicon that allow for 3D integration and are formed by consecutive steps of etching, insulation, deposition of seed layer, and metallization. The use of TSV leads to several advantages such as: reduced interconnect length, lower power consumption, increased interconnect density, and ultimately higher functionality and performance, e.g. enhancing signal transmission speed. Faster interconnections between multiple dies and shorter lengths compared to two-dimensional (2D) integration also ensure lower capacitive, resistive, and inductive parasitics [2], [3]. TSV fabrication can be categorized based on the steps relative to the complementary metal-oxide-semiconductor (CMOS) fabrication process, such as: via first, if the TSV is formed before the CMOS, via middle and via last, where the TSV is fabricated after completing the CMOS processes [1].

The most promising applications for 3D integration using TSV are CMOS image sensors, dynamic random access memory (DRAM), and heterogeneous integration of different technologies. In 2007, Toshiba released a CMOS image sensor which was the first commercial product with TSV incorporated in a batch product, and this boosted the growth of 3D integration [4].

However, the main limitations with the standard through-silicon vias fabrication are induced by the so-called scalloping effect, the surface roughness due to the Bosch deep reactive ion etching (DRIE) process [5], [1], [6]. Scalloping may affect the quality of the seed layer and, in turn, of electroplating. In addition, even when ultra-conformal coating techniques, such as atomic layer deposition, are used for the seed layer, scalloping roughness creates issues related to concentration of stress and electric field in the insulator and barrier layer of the TSV [7], leading to dielectric breakdown and Cu diffusion during the electroplating step [8].

Accordingly, in light of the above-described problems and limitations that are associated within the TSV manufacturing and the resulting scalloping effect, substantially improved manufacturing techniques are desired, for creating smoother surfaces for vias.

SUMMARY

According to one aspect of the present invention, a method and system for manufacturing vias in a silicon wafer is provided. Preferably, the silicon wafer has a <110> crystal orientation, and having a <111> plane that is perpendicular to a surface of the wafer, tilted by 35.26°. Moreover, the method includes the steps of depositing a mask having a rhombus-shaped or rhomboidal-shaped opening onto a surface of the silicon wafer, such that edges of the rhomboidal-shaped opening line up with a <111> plane of a crystalline structure of the silicon wafer, etching a hole in the silicon wafer at the rhomboidal-shaped opening, and polishing the hole after the etching by an anisotropic etching, preferably a wet etching, for example a KOH etching.

According to another aspect of the present invention, a method for manufacturing vias in a crystalline wafer is provided, the crystalline wafer having an anisoptropically strong crystal plane that is arranged to be perpendicular to a surface of the wafer. Preferably, the method includes the steps of providing a mask having a rhomboidal-shaped opening onto a surface of the crystal wafer, such that edges of the rhomboidal-shaped opening line up with intersection lines with the surface of the water and the anisotropically strong plane of a crystalline structure of the crystalline wafer, etching a hole in the crystalline wafer at the rhomboidal-shaped opening; and polishing the hole after the etching by an anisotropic etching.

According to some aspects of the herein presented method and system, a new approach is provided to the manufacturing of vias or holes in silicon wafers or other types of wafers that have an anistropically strong crystal plane, more specifically to the manufacturing of TSV, which is based on a procedure that exploits the crystalline orientation of silicon wafers, to thereby polish the TSV holes and to fabricate scalloping-free, non-tapered, high aspect ratio holes. Thanks to this novel approach, for the very first time, scallop-free holes are obtained with an aspect ratio up to 28:1, an unprecedented result in TSVs. These holes then allow the deposition of higher quality seed layer, which is recognized to be the most critical aspect for a good TSV fabrication process.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE SEVERAL VIEWS OF THE FIGURES

The accompanying drawings, which are incorporated herein and constitute part of this specification, illustrate the presently preferred embodiments of the invention, and together with the general description given above and the detailed description given below, serve to explain features of the invention.

FIG. 6A-6C show different perspective view of wafers that have been processed by the herein presented method, with FIG. 6A showing a cut-out perspective top-side view of a wafer having a hole, for example a TSV, after an etching step, showing a roughened surface structure inside the hole, FIG. 6B showing the same hole after the polishing step by anisotropic etching, preferably the KOH etching step, and FIG. 6C shows a top perspective view of a wafer having a matrix of rhomboidal-shaped holes formed in a high-density pattern, manufactured therein by the herein presented method;

Herein, identical reference numerals are used, where possible, to designate identical elements that are common to the figures. Also, the images in the drawings are simplified for illustration purposes and may not be depicted to scale.

DETAILED DESCRIPTION OF THE SEVERAL EMBODIMENTS

Figure 7:
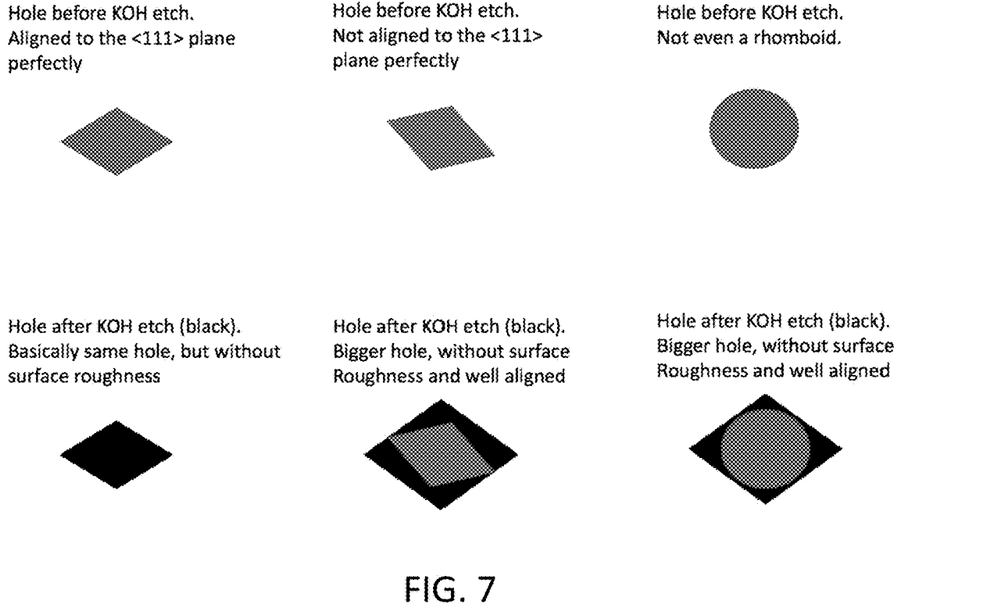
FIG. 7 show a schematic representation of the etching and polishing steps performed with and without alignment of the rhomboidal-shaped openings in the mask to the <111> plane.

According to one aspect of the present invention, with the herein presented method and corresponding system, a manufacturing process is provided for making holes, more specifically TSV holes, into a silicon wafer, or other crystalline wafer or substrate, having inner surface of superior quality as compared to the state of the art. In this process, the silicon structural planes with orientation <111> are used for formation of the inner surfaces of the holes or TSV. This process can be applied to any crystalline wafer which has anisotropical etching properties with respect to one or more chemical etchants. Herein, one variant is discussed, where potassium peroxide (KOH) is applied to silicon crystalline wafers, as the <111> plane of silicon is more resistant to KOH etching than the other crystalline planes. Wafers or substrates are chosed for the process that have a crystalline orientation such that one or more of the "strong" planes, e.g. the <111> plane, of the crystal orientation is perpendicular to the upper or top surface, being the surface that will be further covered by a mask and etched for forming the holes or TSV, as further discussed below. In case of what is called standard silicon <110> wafers, the strong plane, which is the <111> plane for silicon (Si), happen to be tilted by 35.26° with respect to a surface that is defined by the main flat. Thereafter, a mask is provided to the upper or top surface of the wafer, the mask having rhomboidal-shaped openings for forming the holes or TSV, the rhomboidal-shaped openings having two (2) pairs of parallel edges. If the mask is not properly aligned with respect to the <111> planes, hereinafter also referred to as the "strong" planes, the anisotropical etchant will etch the not aligned part and adjust itself to be aligned, as shown in FIG. 7.

Figure 8:
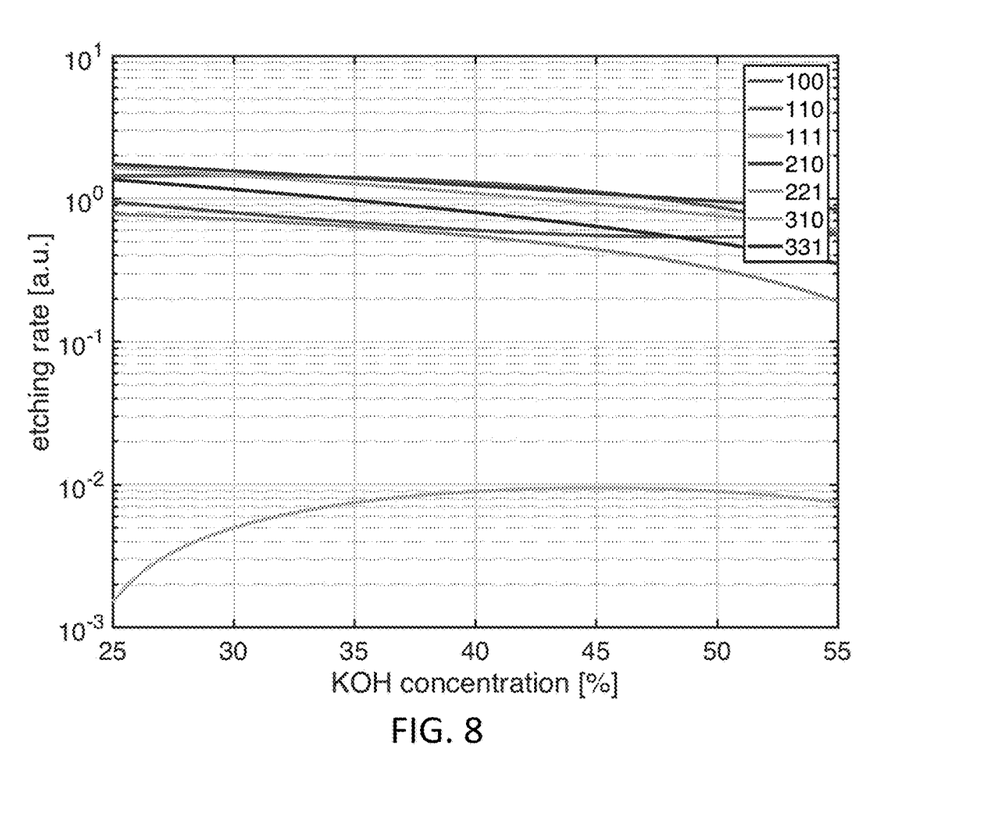
FIG. 8 shows an exemplary graph that shows the different etching rates for different types of crystal plane orientations, with the <111> having the slowest etching rate, with the example for a silicon (Si) wafer and KOH concentration.

Generally, if the herein described method is applied to wafers that are made of material other than Si, the strong crystalline plane is defined as the plane of the crystals that, when facing the etching surface, has the slowest etch rate given a specific etchant. In the case of Si, the <111> plane has the lowest etching rate as compared to the other crystal planes. For example, as illustrated in FIG. 8, the etching rate is shown as a function of the KOH etchant concentration for a Si wafer, where the lowest curve of the graph corresponds to the etching rate of the the <111>, being substantially lower than the etch rates of all other crystalline planes of an Si wafer.

For silicon wafers, after the crystalline silicon is grown to an ingot, the ingot gets sliced in a particular crystalline direction and polished to form the wafer, which cut direction can be defined by standards. For example, for Si:100 wafers, the <100> crystalline plane faces outwards the wafer top surface, has the <110> plane aligned to the main flat and has, as a consequence, no <111> plane is aligned vertically. For Si:110 wafers, the <110> plane exits from the top surface, and as the <1-10> plane is aligned with the main flat, two <111> planes are aligned vertically, at an angle of 35.26 degrees with respect to the main flat.

The rhomboidal-shaped openings are arranged relative to the wafer such that one pair of parallel edges are lined up or are in parallel with intersection lines on the upper or top surface of the wafer with one of the <111> planes, and the other pair of parallel edges are lined up or are in parallel with intersection lines on the upper or top surface of the wafer with another one of the <111> planes. The intersection lines on the upper or top surface of the wafer or substrate are defined by an intersection of the <111> plane and the other <111> plane of the crystalline structure with the upper or top surface of the crystalline silicon wafer or substrate.

For other types of wafers that are not made of Silicon, and have another type of crystal structure, depending on the orientation of the anisotropically strong planes, the rhomboidal-shaped openings can be square-shaped, which means the two (2) pairs of parallel edges are arranged perpendicular to each other, which also means that the intersection lines are also parallel to each other. For example, it is possible that another crystalline wafer is used that has a strong <100> plane or <110> plane, and not the <111> plane unlike a Silicon wafer. In such case, it would be possible to make the openings square-shaped by using a wafer with <100> plane facing outwards and <110> plane aligned to the main flat. For example, it is possible to perform anisotropic etching for wafers that are made of Silicon Carbine (SiC), Aluminum Nitride (AlN), and Gallium Nitride (GaN), to apply the principles of the herein presented method.

For experimental purposes, the rhomboidal holes or openings in the mask were chosen to have the dimensions with a diagonal size ranging from 1.5 μm to 20 μm, along the longer axis of the rhomboidal-shaped opening, and the pitch between neighboring holes was as small as 1.2 times with respect to the major diagonal and as large as five (5) times. Holes have been fabricated on an exemplary 100 mm, 525 μm thick wafers with Si <110> crystalline orientation. However, other dimensions can be used, depending on the requirements for the TSV and their application.

Figure 1:
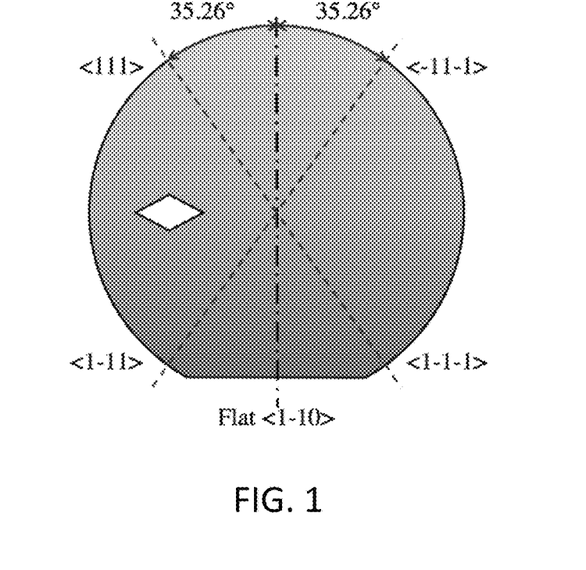
FIG. 1 shows a wafer crystalline orientation of the <111> planes for the <110>type silicon wafers and showing the primary flat.
Figure 2:
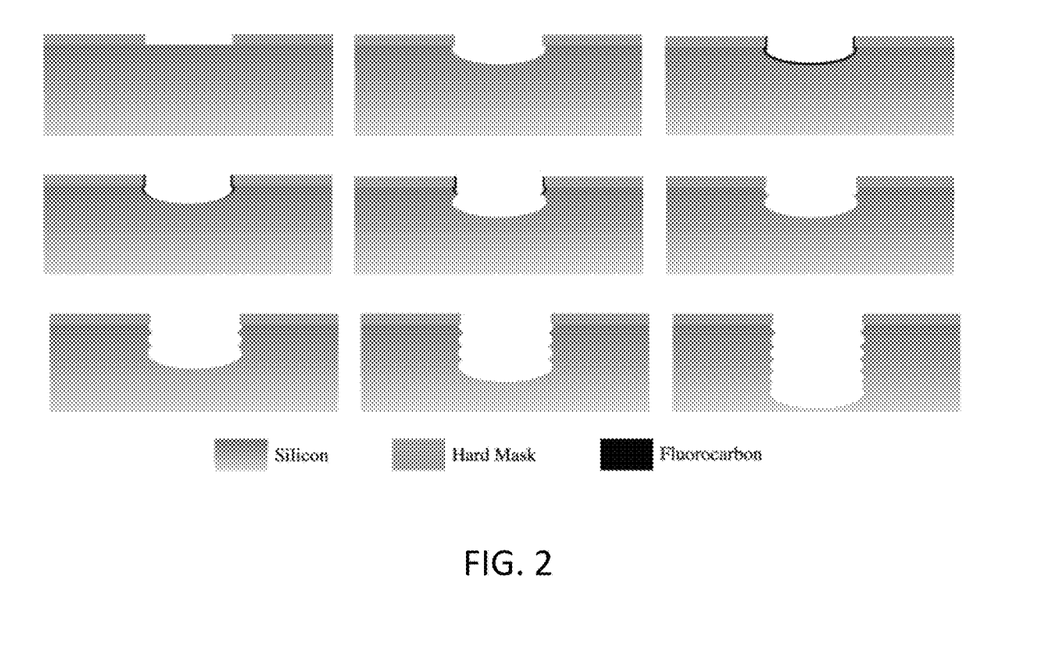
FIG. 2 shows different steps of the etching process, where after patterning the features on a hard mask (a), the etching step is performed (b) is followed by fluorocarbon passivation (c), subsequent depassivation on the bottom of the holes (d) and a new etching step (e). The extra step of $O_2$ plasma cleaning (f) allows to reduce the surface roughness on the walls of the holes [10] and closes the cycle. Third (g), fourth (h) and N-th (i) cycle of the process. The aspect ratio dependent etching (ARDE) shown in (i) explains the so-called saturation of the DRIE process.

Moreover, the mask deposited onto the top or upper surface of the wafer or substrate the rhomboidal-shaped openings can be an oxide layer. The mask is first deposited to the upper or top surface of the wafer or substrate, and then wet oxidation was performed to thin the layer down to obtain an exemplary 1.7 μm thick $SiO_2$ layer. This $SiO_2$ hard mask was thick enough to ensure a good aspect ratio while avoiding the complication and further optimization. The wafer was then coated with 600 nm of AZ ECI 3007 positive tone photoresist and patterned by i-line ($\lambda$=365 nm) photolithography using a Süss MA-6 Gen 3 mask aligner and a chromium mask, to prepare the formation of the rhomboidal-shaped openings therein. The mask was designed in repeated dices fashion, as can be shown from FIG. 1, where both diameter and density factor were swept in each dice. The pattern was then transferred to the $SiO_2$ hard mask to form the openings into the mask by means of fluorine plasma etching. Thereafter, the holes or TSV in the silicon substrate were anisotropically etched using an Alcatel AMS 200 dielectric and silicon etcher system. This is shown in U.S. Pat. No. 5,501,893, also sometimes referred to as the "Bosch" etching process, this reference herewith incorporated by reference in its entirety. The anisotropically etching process is based on alternating depassivation, etch and repassivation steps, and was set up using $SF_6$ etching plasma and $C_4F_8$ coating gas, pulsed at 6 and 2 seconds respectively, which resulted into relatively high aspect ratio (AR=10:1), relatively tapered holes with evident scalloping roughness on the walls. Other types or methods can be used to form the raw hole or TSV through the opening of the mask, for example but not limited to cryo-etching, or different types of deep reactive ion etching.

Figure 4:
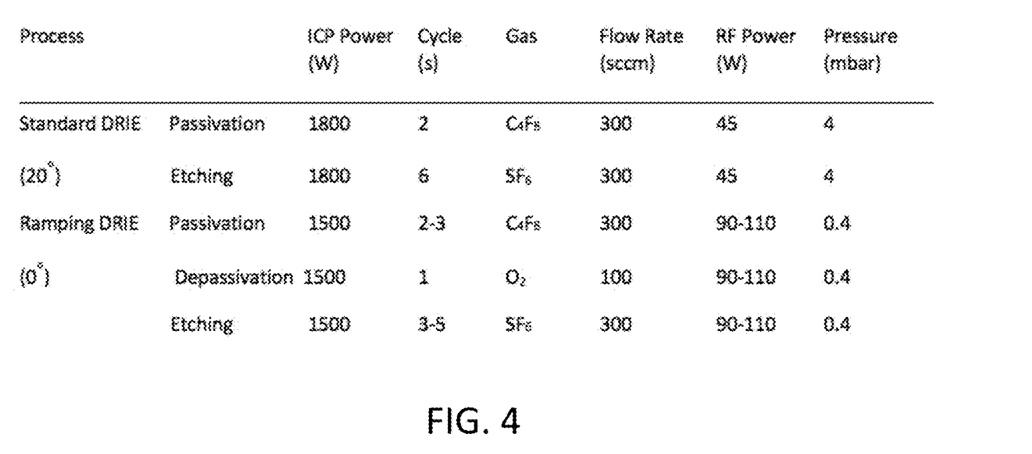
FIG. 4 show a table with parameters of the DRIE etching process.
Figure 5:
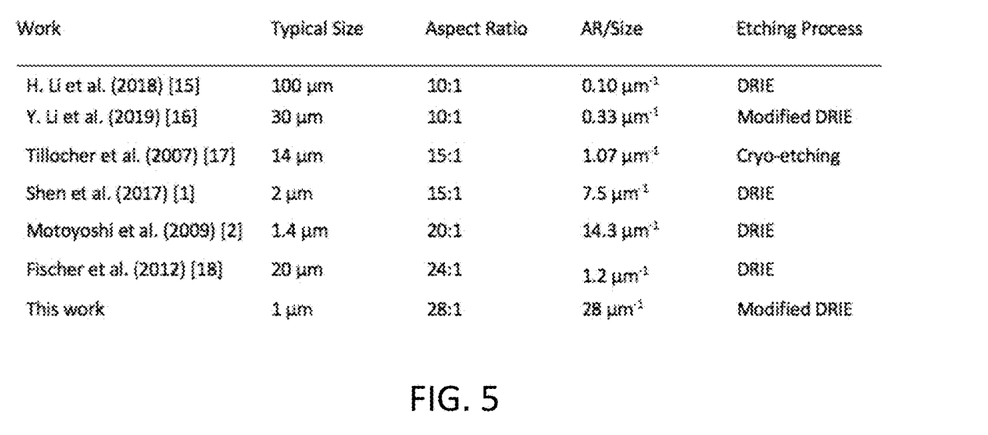
FIG. 5 shows a table comparing several deep reactive ion etching methods to the features of the present method and system.
Figure 6A:
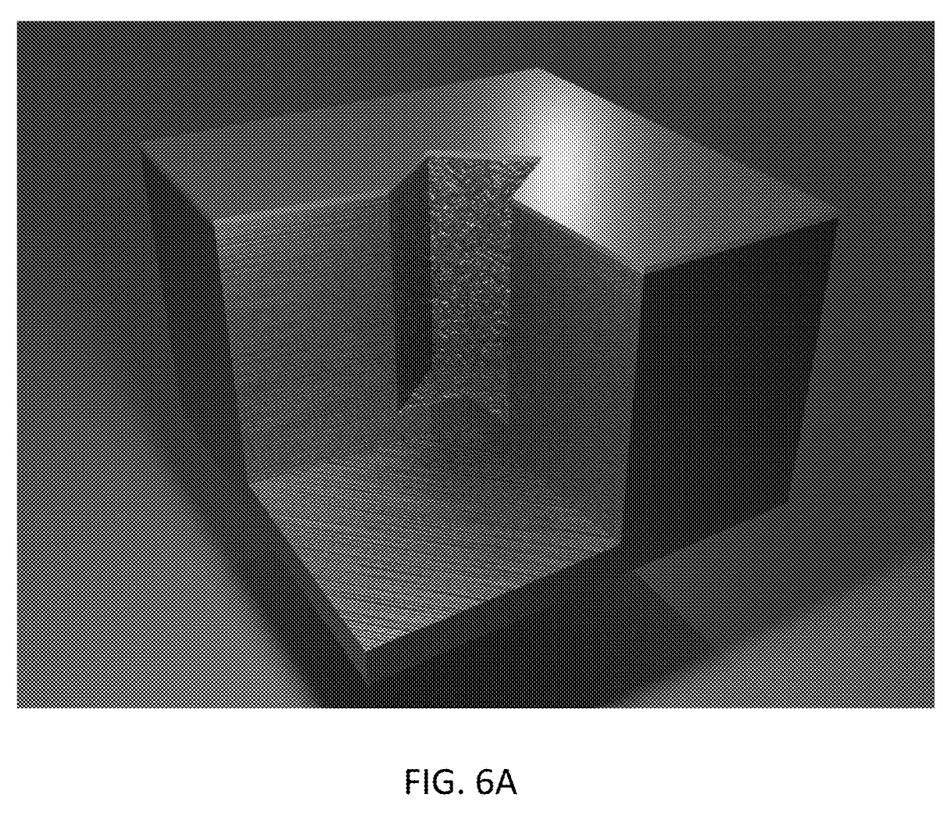
Figure 6B:
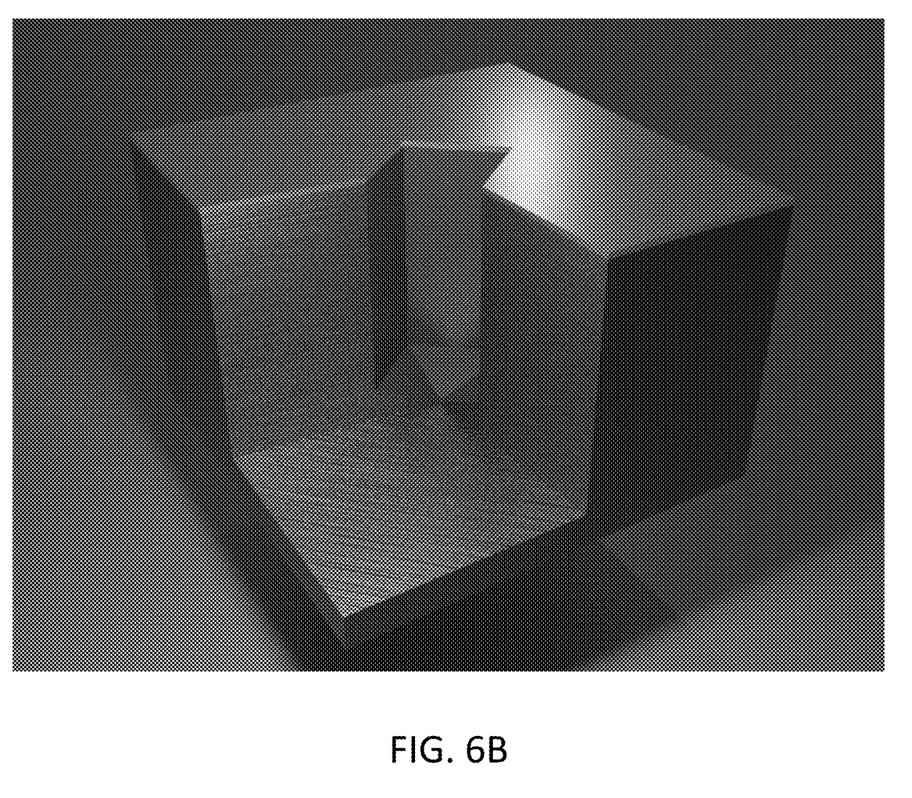

According to another aspect of the present invention, an alternative and more optimized process has been developed by using a modified approach that is based on the anisotropical etching process as shown in U.S. Pat. No. 5,501,893. Specifically, a cleaning step of $O_2$ plasma is added between passivation and depassivation steps, in order to clean the excess passivation left over after the plasma etching. The addition of this extra step, the use of a lower chamber pressure, higher plasma bias power and lower chamber temperature of 0° C., as well as the ramping of process parameters, as can be seen in Table I that is shown in FIG. 4, and this resulted in a much sharper deep reactive ion etching process, with less rough walls and comparable etching rate to the room temperature process, which reached holes with aspect ratios as high as 28:1 and deep trenches with aspect ratios of 75:1. No particular effect in terms of maximum hole depth with respect to different pitch variations was observed. A high aspect ratio may be an interesting aspect for the optimization of a TSV technology process when making the holes.

Parasuraman et al. [11] show the results of fabrication of deep silicon trenches with an aspect ratio of 160:1 by extreme process optimization and trench sizes as small as 250 nm, and they show how the achievable aspect ratio increases with smaller feature size. Other interesting results were presented by Owen et al. [12] achieving an aspect ratio of 97:1 with trenches as large as 3 μm and by Xu et al. [10] where they achieved an aspect ratio of 31.4:1 with 12 μm trenches. Also, to be noted is that, differently from the state of the art, the etching parameters have been optimized for holes and not for trenches, which present a much smaller gas inlet while compared to long trenches. The Knudsen transport model [13] is even more limiting for holes than it is for trenches, which explains the large differences in achievable aspect ratio using the same process.

Preferably, the holes formed by the method herein described have form a small footprint on an exposed surface of the wafer, to benefit from the advantageous results of the polishing to remove the scalloping effects, for example having an opening surface area of less than 1000 μm², otherwise the scalloping effects on the side walls would be irrelevant as not substantially interfering with the relative overall dimensions. As another example, a length of the longer axis of the rhomboidal-shaped opening is preferably less than 30 μm, for the reasons discussed above. Also, preferably, the holes formed by the present method can be traversing holes that go all the way through the wafer, for example TSV holes. Moreover, preferably, a depth of the holes is such that it is deeper as a width of the opening, for example deeper than a length of the longer axis of the rhomboidal-shaped opening. Other dimensions for the holes is also possible.

In order to eliminate scalloping, a new fabrication approach is herein presented, which introduces a new step be added to anistropical etching process of silicon wafers or any other type of DRIE processes, the Michelangelo step. This new process exploits the anisotropic etching properties of potassium hydroxide (KOH) on silicon in order to completely remove the scalloping after the anistropical etching process or Bosch process, polish the internal surfaces of the holes, and then allow a better quality of high aspect ratio holes. Specifically, after the fabrication of the hole with classical methods, a hole surface polishing step is performed that includes a bath of potassium hydroxide (KOH) solution at 40% heated to 60° C., which is herein called the Michelangelo step. By aligning the edges of the rhomboidal-patterned holes of the mask layer to the <111> plane of the Si <110> wafer, the KOH step only acts on the scalloping roughness and the taper effects of the fabricated holes, while avoiding lateral etching to the walls. On the bottom end of the hole, other <111> planes are met by the KOH, which is what gives the pyramidal shape that can be shown in FIG. 3E. After cleaning the hole by the "excess" silicon, the wafer is first put into a HCl bath for potassium particle removal, and then into a buffered hydrofluoric acid (BHF) bath at room temperature for the removal of the excess $SiO_2$ hard mask.

We performed TSV fabrication on Si <110> wafers both with and without the proposed wall polishing step. The depth obtained after the deep reactive ion etching was not equal for all hole sizes because the etching rate slows down with increasing aspect ratio: this effect is commonly known as Aspect Ratio Dependent Etching (or ARDE) [14].

Figure 3A:
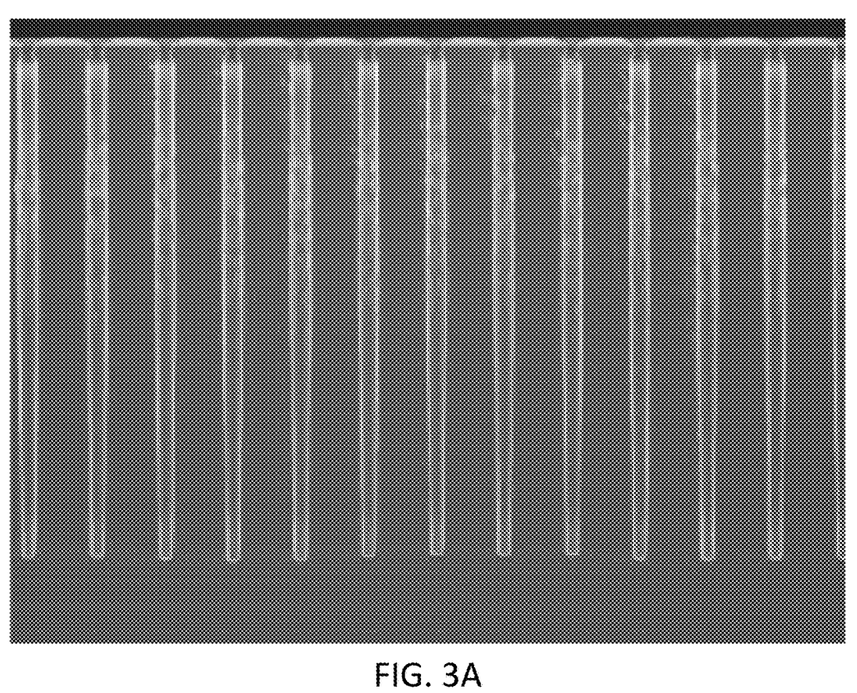
FIGS. 3A to 3E show different cross-sectional views of the silicon wafer with via holes therein, with FIG. 3A showing scanning electron micrograph of TSV holes fabricated with the optimized deep reactive ion etching, FIG. 3B showing scanning electron micrograph of TSV trenches fabricated with the optimized deep reactive ion etching, FIG. 3C showing a scanning electron micrograph of the Michelangelo-processed TSV hole with an AR of 28:1, and FIG. 3D showing a scanning electron micrograph of TSV holes fabricated without the polishing step, for example by KOH etching, referred herein as the michelangelo step, FIG. 3E showing a scanning electron micrograph of TSV holes fabricated with the polishing step, for example a wet etching such as a KOH etching, and it can be seen in FIGS. 3D and 3E, the holes here are 5 μm wide and 40 μm deep, both the scalloping and the tapering effects are removed by the polishing step, for example after immerging the wafer for 60 minutes in a potassium peroxide bath solution at 40% heated up to 60° C.
Figure 3B:
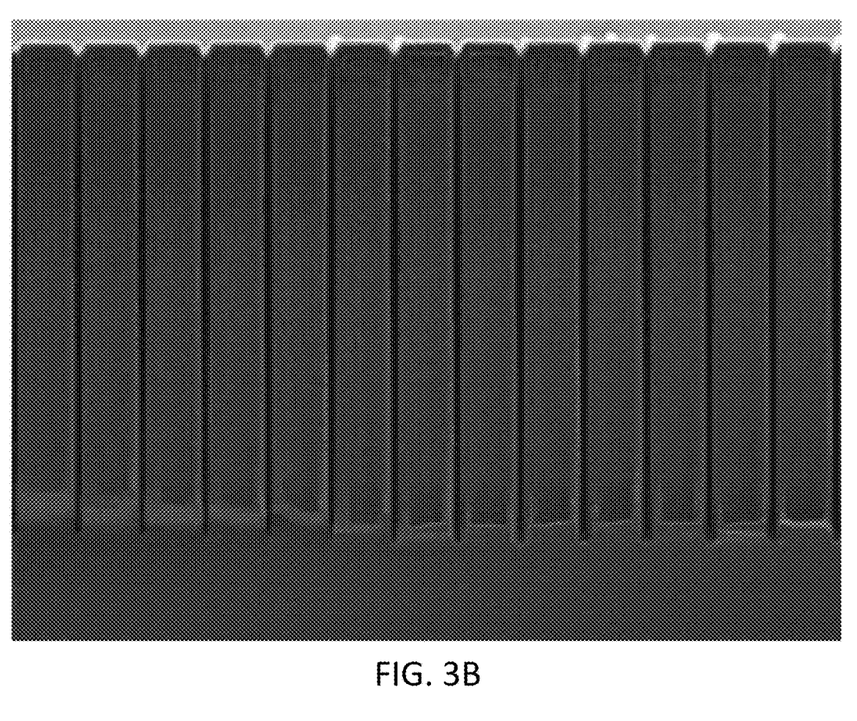
Figure 3C:
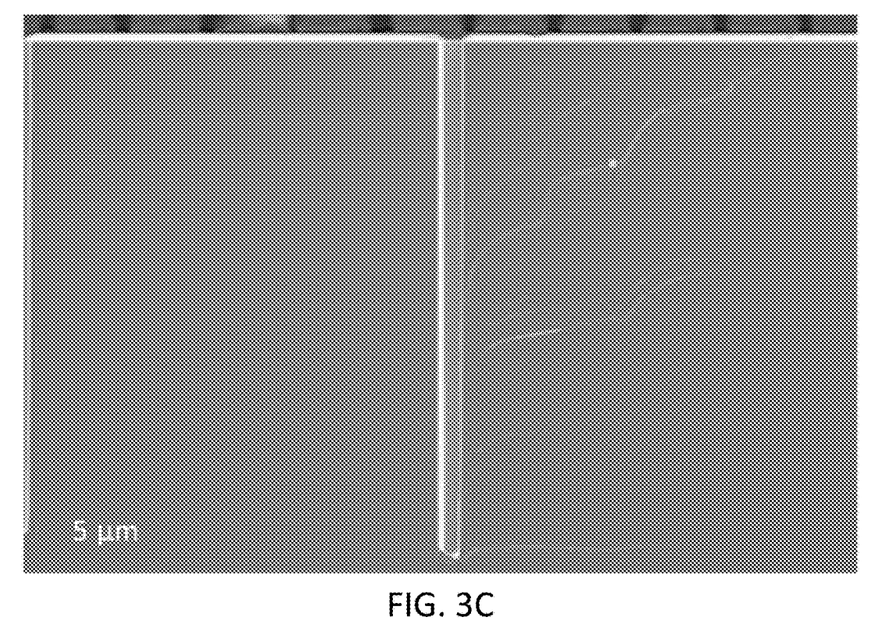
Figure 3D:
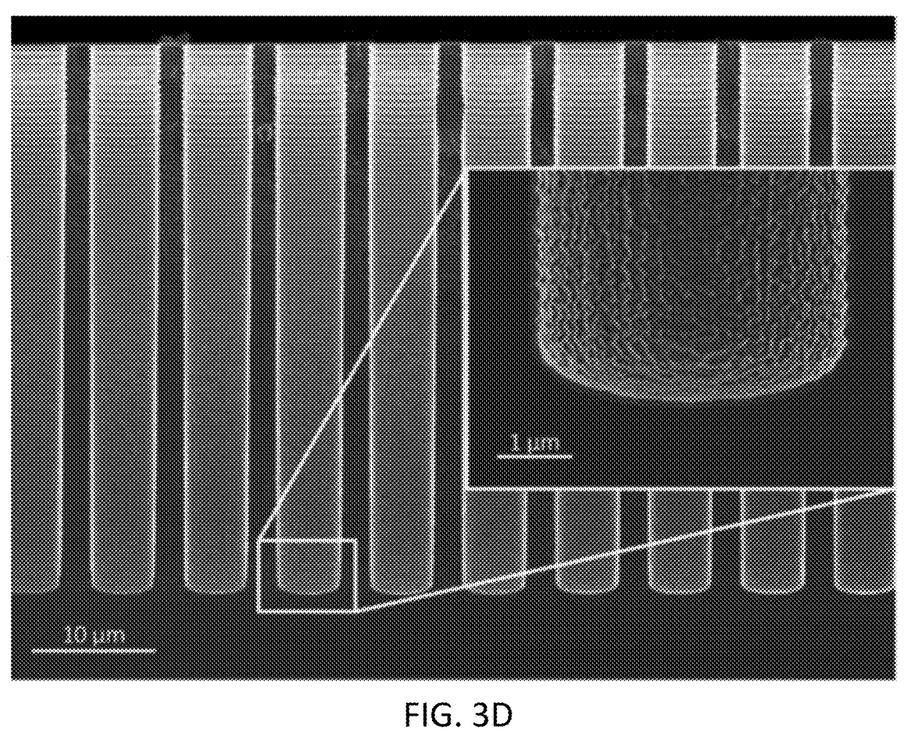
Figure 3E:
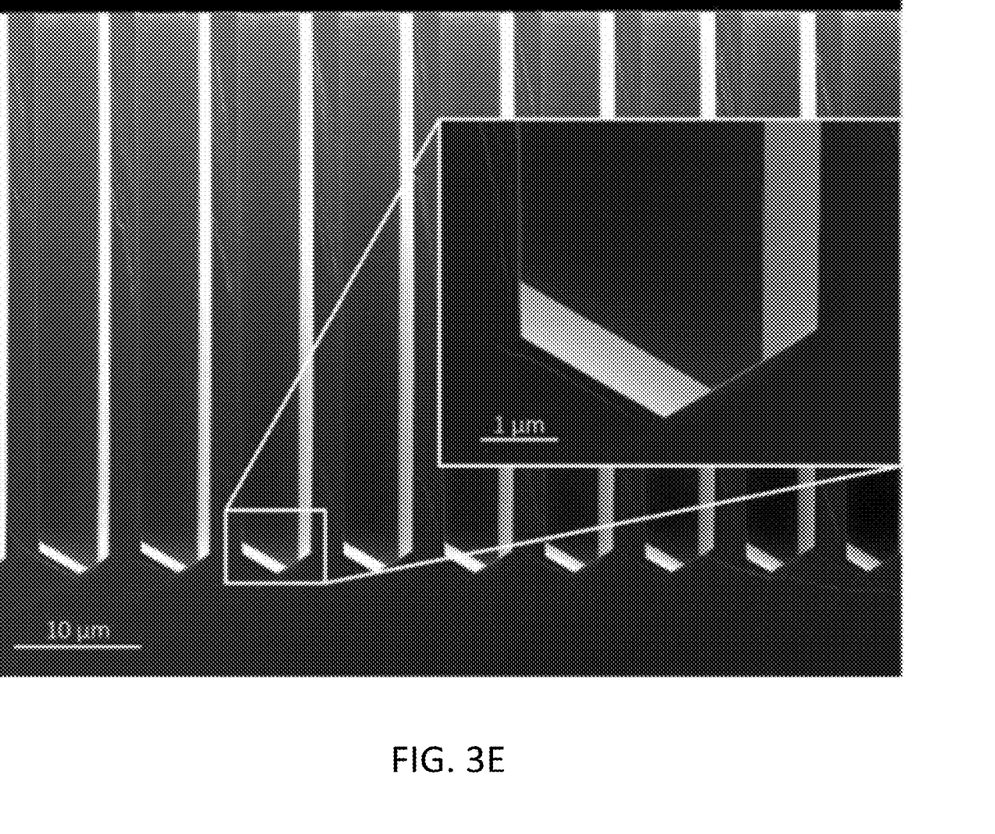

FIGS. 3D and 3E show the remarkable results obtained with and without our Michelangelo step. It is evident that, together with any effect related to the wall scalloping, also the effect of tapering in the hole disappears after KOH anisotropic etching. The Michelangelo step allows polishing of vertical walls on every silicon wafer that has vertical <111> direction perpendicular to the plane of the wafer, such as the Si <110> that we used in this work. Proper design of the hole geometry has then to be considered when changing the silicon wafer crystalline orientation. The complete removal of scalloping on the side walls of TSVs allows better fabrication, since the polished walls prevent unwanted effects, such as stress and electric field concentration. Moreover, it helps with the deposition of insulating and seed layers when using deposition techniques different from atomic layer deposition, such as low pressure chemical vapor deposition (LPCVD).

CMOS technology prefers the use of Si <100> wafers for their better silicon dioxide quality. Having a lower silicon atom density at the surface of the silicon-silicon dioxide interface leads to a lower amount of dangling bonds which, in turn, leads to higher carrier mobility. For this reason, the impact of our Michelangelo technology on the CMOS industry may be challenging.

However, this does not apply for other silicon technologies, such as development of top layers of three-dimensionally (3D) integrated imaging sensors such as APDs, CMOS image sensors (CIS), SPADs and other technologies, or even superconducting circuits technology, such as, for instance, rapid single flux quantum (RSFQ) electronics. Moreover, it is possible to apply a variation of this process while dealing with non-Si technologies, such as InP, InGaAs and other III-V technologies.

FIG. 7 shows a schematic representation of effects resulting from the alignment or non-alignment of the rhomboidal-shaped opening with the <111> plane of the silicon wafer. Basically, the anisotropic etching by KOH etches silicon in some directions faster than in others: that is why holes are prepared to have rhomboidal-shape, in such a way that the inner wall of the hole or TSV is "facing" the KOH is already in the direction that is harder to etch. The KOH will then etch only the silicon which is not in the wall's direction, being uneven of the structures of the wall that provide for the roughness. This way a high level of polishness can be provided. However, as shown in FIG. 7, when the mask is misaligned from the 35.26 degrees, eventually the KOH will etch everything up to the <111> plane.

In sum, with the herein presented method and system, presented the effect of an additional fabrication step, which allows an extremely effective polishing of the TSV's walls fabricated on Si <110> wafers. Scalloping removal might have a relevant impact for the yield of high aspect ratio TSVs. The name of Michelangelo step is related to the famous quote by Michelangelo Buonarroti: The sculpture is already complete within the marble block, before I start my work. It is already there; I just have to chisel away the superfluous material. Indeed, with the final KOH etching step, we just selectively remove all that is superfluous, i.e. the scalloping. The Michelangelo process is currently under patenting.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

REFERENCES

[1] W.-W. Shen and K.-N. Chen, "Three-dimensional integrated circuit (3d ic) key technology: Through-silicon via (tsv)," *Nanoscale Research Letters*, vol. 12, no. 1, p. 56, January 2017. [Online]. Available: https://doi.org/10.1186/s11671-017-1831-4

[2] M. Motoyoshi, "Through-silicon via (tsv)," *Proceedings of the IEEE*, vol. 97, no. 1, pp. 43-48, January 2009.

[3] J. P. Gambino, S. A. Adderly, and J. U. Knickerbocker, "An overview of through-silicon-via technology and manufacturing challenges," *Microelectronic Engineering*, vol. 135, pp. 73-106, 2015. [Online]. Available: http://www.sciencedirect.com/science/article/pii/S0167931714004511

[4] M. Sekiguchi, H. Numata, N. Sato, T. Shirakawa, M. Matsuo, H. Yoshikawa, M. Yanagida, H. Nakayoshi, and K. Takahashi, "Novel low cost integration of through chip interconnection and application to cmos image sensor," in *56th Electronic Components and Technology Conference 2006*, May 2006, pp. 8.

[5] S. Killge, V. Neumann, and J. W. Bartha, *Copper-Based TSV. Interposer*. Cham: Springer International Publishing, 2016, pp. 9-28. [Online]. Available: https://doi.org/10.1007/978-3-319-20481-9_2

[6] T. Wei, J. Cai, Q. Wang, Y. Hu, L. Wang, Z. Liu, and Z. Wu, "Optimization and evaluation of sputtering barrier/seed layer in through silicon via for 3-d integration," *Tsinghua Science and Technology*, vol. 19, no. 2, pp. 150-160, April 2014.

[7] P. Lin, G. Zhang, H. van Zeijl, B. Lian, Y. Wang, and Q. Yao, "Effects of silicon via profile on passivation and metallization in tsv interposers for 2.5d integration," *Microelectronic Engineering*, vol. 134, pp. 22-26, 2015. [Online]. Available: http://www.sciencedirect.com/science/article/pii/S0167931715000179

[8] N. Ranganathan, D. Y. Lee, L. Youhe, G. Lo, K. Prasad, and K. L. Pey, "Influence of bosch etch process on electrical isolation of tsv structures," *IEEE Transactions on Components, Packaging and Manufacturing Technology*, vol. 1, no. 10, pp. 1497-1507, October 2011.

[9] F. Laermer and A. Schilp, U.S. Pat. No. 5,501,893 and European Patent EP 625285, 1996.

[10] T. Xu, Z. Tao, H. Li, X. Tan, and H. Li, "Effects of deep reactive ion etching parameters on etching rate and surface morphology in extremely deep silicon etch process with high aspect ratio," *Advances in Mechanical Engineering*, vol. 9, no. 12, p. 1687814017738152, 2017. [Online]. Available: https://doi.org/10.1177/1687814017738152

[11] J. Parasuraman, A. Summanwar, F. Marty, P. Basset, D. E. Angelescu, and T. Bourouina, "Deep reactive ion etching of sub-micrometer trenches with ultra high aspect ratio," *Microelectronic Engineering*, vol. 113, pp. 35-39, 2014. [Online]. Available: http://www.sciencedirect.com/science/article/pii/S0167931713005431;

[12] K. J. Owen, B. VanDerElzen, R. L. Peterson, and K. Najafi, "High aspect ratio deep silicon etching," in *2012 IEEE 25th International Conference on Micro Electro Mechanical Systems (MEMS)*, January 2012, pp. 251-254;

[13] J. W. Coburn and H. F. Winters, "Conductance considerations in the reactive ion etching of high aspect ratio features," *Applied Physics Letters*, vol. 55, no. 26, pp. 2730-2732, 1989. [Online]. Available: https://doi.org/10.1063/1.101937;

[14] J. Yeom, Y. Wu, J. C. Selby, and M. A. Shannon, "Maximum achievable aspect ratio in deep reactive ion etching of silicon due to aspect ratio dependent transport and the microloading effect," *Journal of Vacuum Science & Technology B: Microelectronics and Nanometer Structures Processing, Measurement, and Phenomena*, vol. 23, no. 6, pp. 2319-2329, 2005. [Online]. Available: https://avs.scitation.org/doi/abs/10.1116/1.2101678;

[15] H. Li, J. Liu, T. Xu, J. Xia, X. Tan, and Z. Tao, "Fabrication and optimization of high aspect ratio through-silicon-vias electroplating for 3d inductor," *Micromachines*, vol. 9, no. 10, p. 528, 2018;

[16] Y. Li, H. Zhang, R. Yang, Y. Laffitte, U. Schmill, W. Hu, M. Kaddoura, E. J. M. Blondeel, and B. Cui, "Fabrication of sharp silicon hollow microneedles by deep-reactive ion etching towards minimally invasive diagnostics," *Microsystems & Nanoengineering*, vol. 5, no. 1, p. 41, 2019. [Online]. Available: https://doi.org/10.1038/s41378-019-0077-y;

[17] T. Tillocher, R. Dussart, X. Mellhaoui, P. Lefaucheux, M. Boufnichel, and P. Ranson, "Silicon cryo-etching of deep holes," *Microelectronic Engineering*, vol. 84, no. 5, pp. 1120-1123, 2007, proceedings of the 32nd International Conference on Micro- and Nano-Engineering. [Online]. Available: http://www.sciencedirect.com/science/article/pii/S0167931707001104;

[18] A. C. Fischer, S. J. Bleiker, T. Haraldsson, N. Roxhed, G. Stemme, and F. Niklaus, "Very high aspect ratio through-silicon vias (TSVs) fabricated using automated magnetic assembly of nickel wires," *Journal of Micromechanics and Microengineering*, vol. 22, no. 10, p. 105001, August 2012. [Online]. Available: https://doi.org/10.1088%2F0960-1317%2F22%2F10%2F105001

The invention claimed is:

1. A method for manufacturing vias in a silicon wafer, the silicon wafer having a<110>crystal orientation, and having a<111>plane that is perpendicular to a surface of the wafer, tilted by 35.26°, the method comprising the steps of:
   providing a mask having a rhomboidal-shaped opening onto a surface of the silicon wafer, such that edges of the rhomboidal-shaped opening line up with a<111>plane of a crystalline structure of the silicon wafer;
   etching a hole in the silicon wafer at the rhomboidal-shaped opening; and
   polishing the hole after the etching by an anisotropic etching.

2. The method according to claim 1, wherein the step of polishing by the anisotropic etching includes a potassium hydroxide (KOH) etching.

3. The method according to claim 1, wherein the step of polishing by the anisotropic etching includes a wet etching.

4. The method according to claim 1, wherein the mask includes a $SiO_2$ hard mask.

5. The method according to claim 1, wherein the etching the hole includes a repetition of the following steps:
   plamsa etching the hole to remove silicon wafer material;
   passivating the hole with fluorocarbon; and
   depassivating a bottom of the hole.

6. The method according to claim 1, wherein the providing the mask includes the steps of:
   coating or oxidizing the surface of the silicon wafer with a $SiO_2$ or other hard mask; and
   patterning the $SiO_2$ or other hard mask to form the rhomboidal-shaped opening by an etching process.

7. The method according to claim 5, wherein the mask includes a $SiO_2$ hard mask,
   plasma cleaning with $O_2$ plasma between the step of passivating and the step of depassivating to clean excess passivation left over after the plasma etching.

8. A method for manufacturing vias in a crystalline wafer, the crystalline wafer having an anisoptropically strong crystal plane that is arranged to be perpendicular to a surface of the wafer, the method comprising the steps of:
   providing a mask having a rhomboidal-shaped opening onto a surface of the crystalline wafer, such that edges of the rhomboidal-shaped opening line up with intersection lines with the surface of the wafer and the anisotropically strong plane of a crystalline structure of the crystalline wafer;
   etching a hole in the crystalline wafer at the rhomboidal-shaped opening; and
   polishing the hole after the etching by an anisotropic etching.

9. The method according to claim 8, wherein the rhomboidal-shaped opening has a square shape.

* * * * *